United States Patent
Hung et al.

(10) Patent No.: US 7,035,449 B2
(45) Date of Patent: Apr. 25, 2006

(54) METHOD FOR APPLYING A DEFECT FINDER MARK TO A BACKEND PHOTOMASK MAKING PROCESS

(75) Inventors: Chang Cheng Hung, Hsin-Chu (CN); Chuan-Yuan Lin, Taipei (TW); Tyng-Hao Hsu, Hsin-Chu (TW); Shu-Chun Lin, Tao-Yung (TW); Chin-Hsiang Lin, Kao-Hsiung (TW)

(73) Assignee: Taiwan Semiconductor Manufacturing Co., Ltd, Hsin Chu (TW)

(*) Notice: Subject to any disclaimer, the term of this patent is extended or adjusted under 35 U.S.C. 154(b) by 682 days.

(21) Appl. No.: 09/991,341

(22) Filed: Nov. 16, 2001

(65) Prior Publication Data

US 2003/0095699 A1 May 22, 2003

(51) Int. Cl.
*G06K 9/00* (2006.01)
(52) U.S. Cl. .............. 382/149; 382/144; 427/140; 356/237.1
(58) Field of Classification Search ............. 382/100, 382/141, 144, 145, 149; 430/5, 22, 30, 942, 430/945; 250/310, 307, 396 R, 492.2, 492.1; 356/237.1, 237.4, 237.5; 427/140, 154, 532, 427/533–554, 595–597
See application file for complete search history.

(56) References Cited

U.S. PATENT DOCUMENTS

| | | | | |
|---|---|---|---|---|
| 3,748,975 A | * | 7/1973 | Tarabocchia | 396/548 |
| 4,131,472 A | * | 12/1978 | MacDonald et al. | 430/30 |
| 4,247,203 A | * | 1/1981 | Levy et al. | 356/398 |
| 6,091,845 A | * | 7/2000 | Pierrat et al. | 382/144 |
| 6,190,836 B1 | * | 2/2001 | Grenon et al. | 430/311 |
| 6,263,292 B1 | * | 7/2001 | Fiekowsky | 702/95 |
| 6,340,543 B1 | * | 1/2002 | Nagamura et al. | 430/5 |
| 6,373,976 B1 | * | 4/2002 | Pierrat et al. | 382/151 |
| 6,476,913 B1 | * | 11/2002 | Machida et al. | 356/394 |
| 6,765,673 B1 | * | 7/2004 | Higashikawa | 356/399 |

\* cited by examiner

*Primary Examiner*—Sheela Chawan
(74) *Attorney, Agent, or Firm*—Tung & Assoc

(57) ABSTRACT

A back-end method for photomask making generally includes the steps of inspecting a photomask and repairing each defect on the photomask. The step of inspecting the photomask preferably comprises a defect finder mark implementation routine. In general, when inspecting the photomask for defects, the defect finder mark implementation routine deposits a defect finder mark on the photomask via a mark installer (not shown) included with a mask marking inspection system. Deposition of the defect finder mark includes establishing a location that is adjacent to the defect and establishing a size that is detectable by a mask repair device (not shown). By deposition on the photomask, the defect finder mark reliably facilitates location of the corresponding defect despite variations in image resolution and stage movement between the mask marking inspection system and the mask repair device.

17 Claims, 2 Drawing Sheets

METHOD FOR APPLYING A DEFECT FINDER MARK TO A BACKEND PHOTOMASK MAKING PROCESS

BACKGROUND OF THE INVENTION

1. Field of the Invention

The present invention generally relates to manufacturing semiconductor circuits via photolithography and, more particularly, but not by way of limitation, to a method for photomask making that applies a defect finder mark to a photomask in the vicinity of a defect during inspection so that the defect can be reliably identified and eliminated from the photomask during repair.

2. Description of the Related Art

Photolithography is a well-known process in the semiconductor manufacturing industry for transferring photographic images of complex circuit patterns onto the surface of a semiconductor wafer substrate. Typically, photolithography requires passing light through a photomask containing circuit patterns to cast an image of that photomask onto the semiconductor wafer substrate.

In particular, the photomask includes a mask substrate and a mask pattern disposed on the mask substrate. Commonly, the mask substrate is composed of a transparent material, such as glass for example, whereas the mask pattern is composed of an opaque material, for example chrome or an emulsion film having opaque particles set therein, such as silver particles. During photolithography, light passes from a light source through the photomask via the mask substrate so that the surface of the semiconductor wafer substrate is exposed. This surface features a uniform layer of photoresist thereon that develops in response to irradiation. The throughput of light across the photomask forms an image on the photoresist that corresponds to the mask pattern. Accordingly, the resulting image is etched so that the semiconductor wafer substrate ultimately forms at least one integrated circuit and/or microcircuit.

Commonly in the industry, each photomask is manufactured by a front-end method and a back-end method for photomask making. Generally, in a manner similar to forming images on the surface of a semiconductor wafer substrate, the front-end method for photomask making forms the desired mask pattern onto the mask substrate. In particular, images for forming the mask pattern are generated by a layout program. An irradiating device maps the images from the layout program onto the mask substrate so that a layer of photoresist on the surface of the mask substrate is exposed to the radiation from the irradiating device.

In particular, the surface of the mask substrate includes a uniform layer of chrome disposed on the mask substrate and a uniform layer of photoresist disposed on the layer of chrome. Responsive to the layout program, the irradiating device forms an image on the photoresist that corresponds to the mask pattern. Typically, the developed image is etched so that the chrome layer thus defines the mask pattern and so that the mask substrate is exposed to facilitate throughput. Subsequent to etching, the front-end method for photomask making further requires removal of photoresist from the photomask.

Generally, to eliminate defects on the photomask arising from the front-end method, the back-end method for photomask making implements quality control procedures. In effect, mitigating or eliminating defects from the photomask with the back-end method reduces the number of defects on semiconductor wafer substrate created from the photomask with the photolithography process.

Commercially available photomask inspection apparatuses are typically used to inspect the photomask for defects. Each photomask is placed on a platform or, commonly, "stage". This stage enables a technician to move the photomask with precision when inspecting the photomask for defects. Photomask inspection apparatuses typically include field of view displays for enabling technicians to visually identify defects. The resolution of the field of view display varies with each photomask inspection apparatus.

Once defects are identified, the photomask is removed from the photomask inspection apparatus and, typically, placed atop a stage within a commercially available mask repair device. Often the task of relocating each defect on the mask repair device is inhibited due to differences in precision stage movement as well as resolution between the mask repair device and the photomask inspection apparatus.

Moreover, defect relocation may be inhibited due to the kind of defect that was initially located. In practice, technicians often readily identify isolated or relatively large defects associated with each photomask. It is, however, very difficult for a technician to spot a small defect or a defect residing in a dense and repetitive pattern region of the mask pattern. Unfortunately, because of the difficulty and large quantity of time invested in locating small defects and/or defects within a dense mask pattern, today's technicians often overlook relocating and, thus, repairing such defects. Cumulatively, failing to repair such defects detrimentally effects the "electrical wafer yield" of the semiconductor wafer substrate that may, ultimately, result in operational failure of the resulting integrated circuit and/or microcircuit.

Accordingly, as a matter of reducing manufacturing time, labor, and cost, there is a long felt need for a method of photomask making that applies a defect finder mark to a photomask in the vicinity of a defect during inspection so that the defect can be reliably identified and eliminated from the photomask during repair.

SUMMARY OF THE INVENTION

In accordance with the present invention, a back-end method for photomask making generally includes the steps of inspecting a photomask and repairing each defect on the photomask. After repairing defects on the photomask, the back-end method further includes the step of cleaning and, optionally, the step of applying pellicle to the photomask. It must be said that the step of inspecting the photomask preferably comprises a defect finder mark implementation routine. In general, the defect finder mark implementation routine deposits a defect finder mark on the photomask. The defect finder mark facilitates easy location of a defect during the back-end process so that the defect may be repaired.

With reference to the defect finder mark implementation routine, the photomask is inspected for defects via a mask marking inspection system. The mask marking inspection system generally includes a photomask inspection apparatus and a mark installer linked with the photomask inspection apparatus. The mark installer operates in cooperation with the photomask inspection apparatus so that the mark installer physically marks the photomask.

Inspection includes a routine for defect capturing that includes the steps of searching and locating defects on the photomask with the mask marking inspection system. In the preferred embodiment, searching the photomask for defects includes searching about the dense pattern array on the photomask. Moreover, searching the photomask for defects includes searching for elusive defects.

Once the defect is captured, the defect finder mark implementation routine advances to dispose a defect finder mark on the photomask via the mark installer of the mask marking inspection system. In the preferred embodiment, the defect finder mark is cut into the mask pattern of the photomask so that the defect finder mark can be eliminated from the photomask by standard defect repair procedures used in the industry. By deposition on the photomask, the defect finder mark reliably facilitates location of the corresponding defect despite variations in image resolution and photomask positioning or, commonly, "stage movement" between the mask marking inspection system and the mask repair device.

The step of disposing the defect finder mark includes establishing a location of the defect finder mark that is adjacent to the defect. Preferably, by establishing an adjacent location, the defect finder mark facilitates quick and easy location of a corresponding defect about the photomask. Depositing the defect finder mark further includes establishing a size for the defect finder mark. In the preferred embodiment, the defect finder mark constitutes a size that is detectable by a mask repair device. Current laser technology can implement 0.3 µm spot size on mask pattern Accordingly, the defect finder mark directs the mask repair device to the vicinity of the corresponding defect so that the mask repair device can reliably identify and eliminate the defect from the photomask.

It should be added that those of ordinary skill in the art will recognize that the steps associated with defect capturing and defect finder mark deposition may be repeated for each defect on the photomask. Thus, in continuing with the defect finder mark implementation routine, the photomask with at least one defect finder mark thereon is removed from the mask marking inspection system and received by the repair device. The mask repair device then searches the photomask for the defect finder mark and repairs the defect that is adjacent to the defect finder mark.

In addition to repairing the defect, the mask repair device eliminates the respective defect finder mark from the photomask. Those of ordinary skill in the art will recognize that any suitable defect repair procedure used in the industry for removing defects from the photomask can also be applied for eliminating the defect finder mark. In one preferred embodiment, for the cavity cut into the mask pattern that defines the defect finder mark, a filing agent comprising carbon film is deposited on the defect finder mark according to a "clear-defect" repair procedure commonly used in the industry to thus eliminate the defect finder mark from the photomask.

The defect finder mark implementation routine concludes by completing the back-end photomask making process so that, ultimately, the defect on the photomask is repaired. Accordingly, the front-end and back-end methods for photomask making ensure that the repaired photomask reliably forms a photoresist image on the semiconductor wafer substrate.

It is therefore an intent of the present invention to provide a back-end method of photomask making that applies a defect finder mark to a photomask in the vicinity of a defect during inspection so that the defect can be reliably identified and eliminated from the photomask during repair.

Still other intentions, objects, features, and advantages of the present invention will become evident to those skilled in the art in light of the following.

BRIEF DESCRIPTION OF THE DRAWINGS

FIG. 1A is a top plan view of the photomask showing the defect finder mark positioned adjacent to a defect (55).

DETAILED DESCRIPTION OF THE PREFERRED EMBODIMENT

Figure 1A:
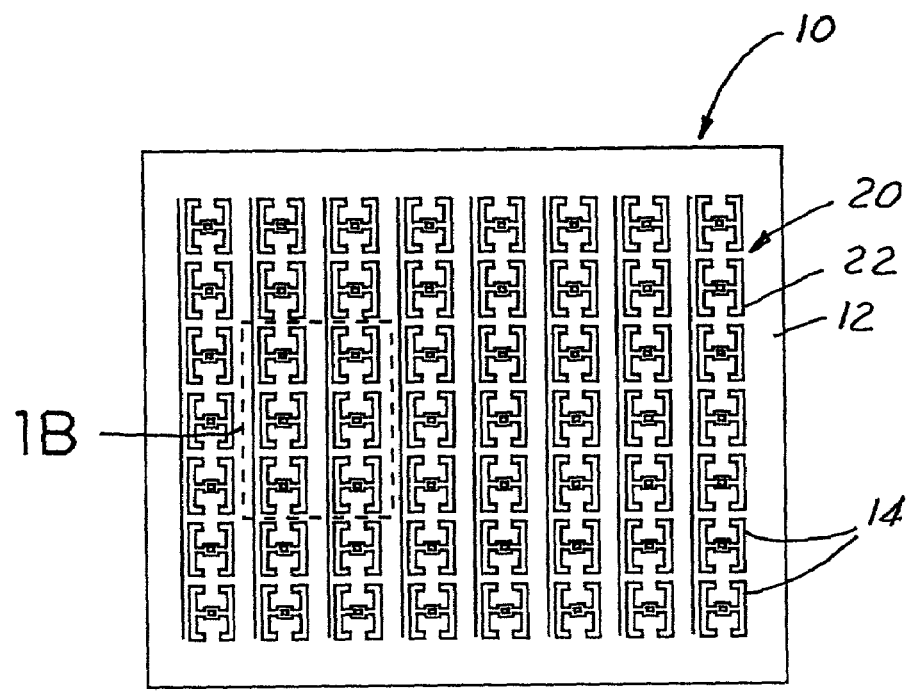
FIG. 1A is a schematic view illustrating a photomask (10) featuring a defect finder mark (30) according to the preferred embodiment. In particular.
Figure 1B:
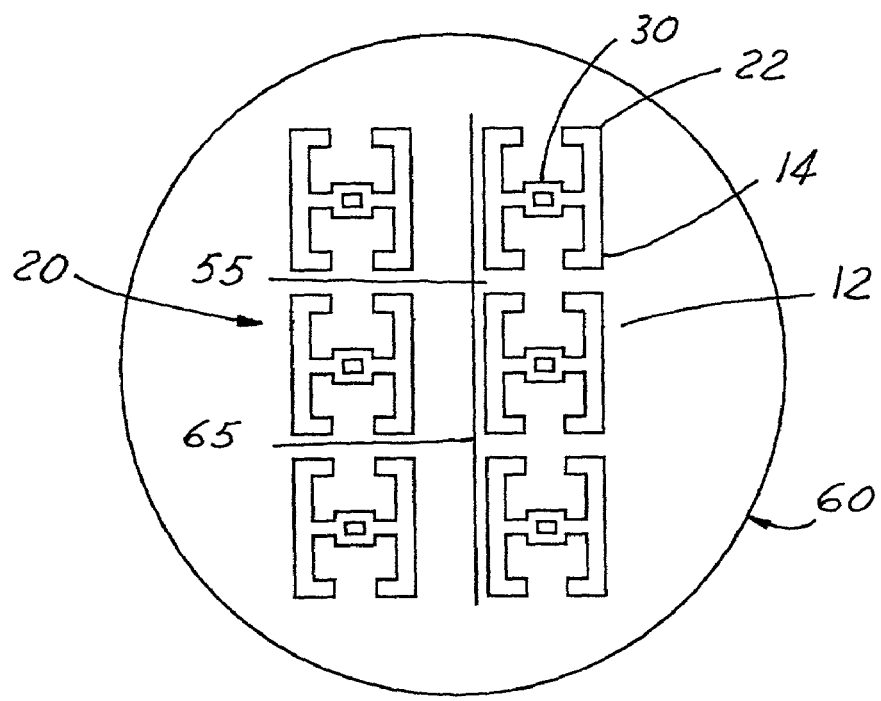
FIG. 1B is a schematic view illustrating the defect finder mark as shown from a mask marking inspection system field of view display (60).

As required, detailed embodiments of the present invention are disclosed herein, however, it is to be understood that the disclosed embodiments are merely exemplary of the invention, which may be embodied in various forms, the figures are not necessarily to scale, and some features may be exaggerated to show details of particular components or steps. Generally, FIGS. 1A and 1B illustrate a photomask 10. In operation, the photomask 10 is used as a part of a standard photolithography process. Photolithography is a well-known process in the semiconductor manufacturing industry for transferring photographic images of complex circuit patterns onto the surface of a semiconductor wafer substrate (not shown).

With reference to FIG. 1A, the photomask 10 includes a mask substrate 12 and a mask pattern 14 disposed on the mask substrate 12. Preferably, the mask substrate 12 is composed of a transparent material, such as glass for example. The mask pattern 14 is composed of an opaque material, for example chrome or an emulsion film having opaque particles set therein, such as silver particles. During photolithography, light passes from a light source through the photomask 10 via the mask substrate 12 so that the surface of the semiconductor wafer substrate is exposed. This surface features a uniform layer of photoresist thereon that develops in response to irradiation. The throughput of light across the photomask 10 forms an image on the photoresist that corresponds to the mask pattern 14. Depending on the type of photoresist used, the resulting image on the semiconductor wafer substrate is either an exact or, commonly, "positive" image or a reverse or, commonly, "negative" image of the mask pattern 14. Accordingly, the resulting image is etched so that the semiconductor wafer substrate ultimately forms at least one integrated circuit and/or microcircuit.

Each photomask 10 is preferably manufactured by a front-end method and a back-end method for photomask making. Generally, in a manner similar to forming images on the surface of a semiconductor wafer substrate, the front-end method for photomask making forms the desired mask pattern 14 onto the mask substrate 12. In particular, images for forming the mask pattern 14 are preferably generated by a layout program. The layout program comprises a suite of computer code-based programs for the design and simulation of integrated circuits. Data from the layout program is used to drive an irradiating device, such as a photo plotter or an electron beam machine for example. The irradiating device maps the images from the layout program onto the mask substrate 12. Therefore, a uniform layer of photoresist on the surface of the mask substrate 12 is exposed to the radiation from the irradiating device.

In the preferred embodiment, the surface of the mask substrate 12 includes a uniform layer of chrome disposed on the mask substrate 12 and a uniform layer of photoresist disposed on the layer of chrome. The layer of photoresist develops in response to irradiation. Accordingly, responsive to the layout program, the irradiating device forms an image on the photoresist that corresponds to the mask pattern 14. In the preferred embodiment, the developed image is etched so that the chrome layer thus defines the mask pattern 14 and so that the mask substrate 12 is exposed to facilitate throughput. Subsequent to etching, the front-end method for photomask making requires removal of photoresist from the photomask 10. Those of ordinary skill in the art will recognize any suitable means for removing photoresist from the photomask 10, such as applying hot acid or oxygen plasma to the photomask 10.

Generally, to eliminate defects on the photomask 10 arising from the front-end method, the back-end method for photomask making implements quality control procedures. In effect, mitigating or eliminating defects from the photomask 10 with the back-end method reduces the number of defects on semiconductor wafer substrate created from the photomask 10 with the photolithography process. Accordingly, reducing the number of defects on the semiconductor wafer substrate favorably increases electrical wafer yield. For example, mitigating or eliminating defects from the photomask reduces "killing defects" associated with operational failure of an integrated circuit defined by the semiconductor wafer substrate.

It must be said that, in the preferred embodiment, the back-end method for photomask making includes mitigating or eliminating elusive defects and/or defects about a dense pattern region of the photomask 10. In the disclosure and the appended claims the term elusive defect refers to defects that are small in size and, thus, difficult to locate by standard mask inspection apparatuses and/or mask repair devices used in the industry. For example, an elusive defect my comprise a buried defect covered by the surface of a semiconductor wafer substrate. Moreover, for this disclosure and the appended claims defects about a dense pattern region of the photomask 10 refers to defects that are difficult to identify and locate amidst the dense pattern region of a photomask. Illustratively, FIGS. 1A and 1B show a defect 55 adjacent to a pattern unit 22 defined by the mask pattern 14. For the photomask 10 of FIGS. 1A and 1B, the pattern unit 22 is repeated throughout so as to define a pattern array 20. The defect 55 of FIGS. 1A and 1B is thus characterized as a defect about the dense pattern array 20 of the photomask 10.

Figure 2:
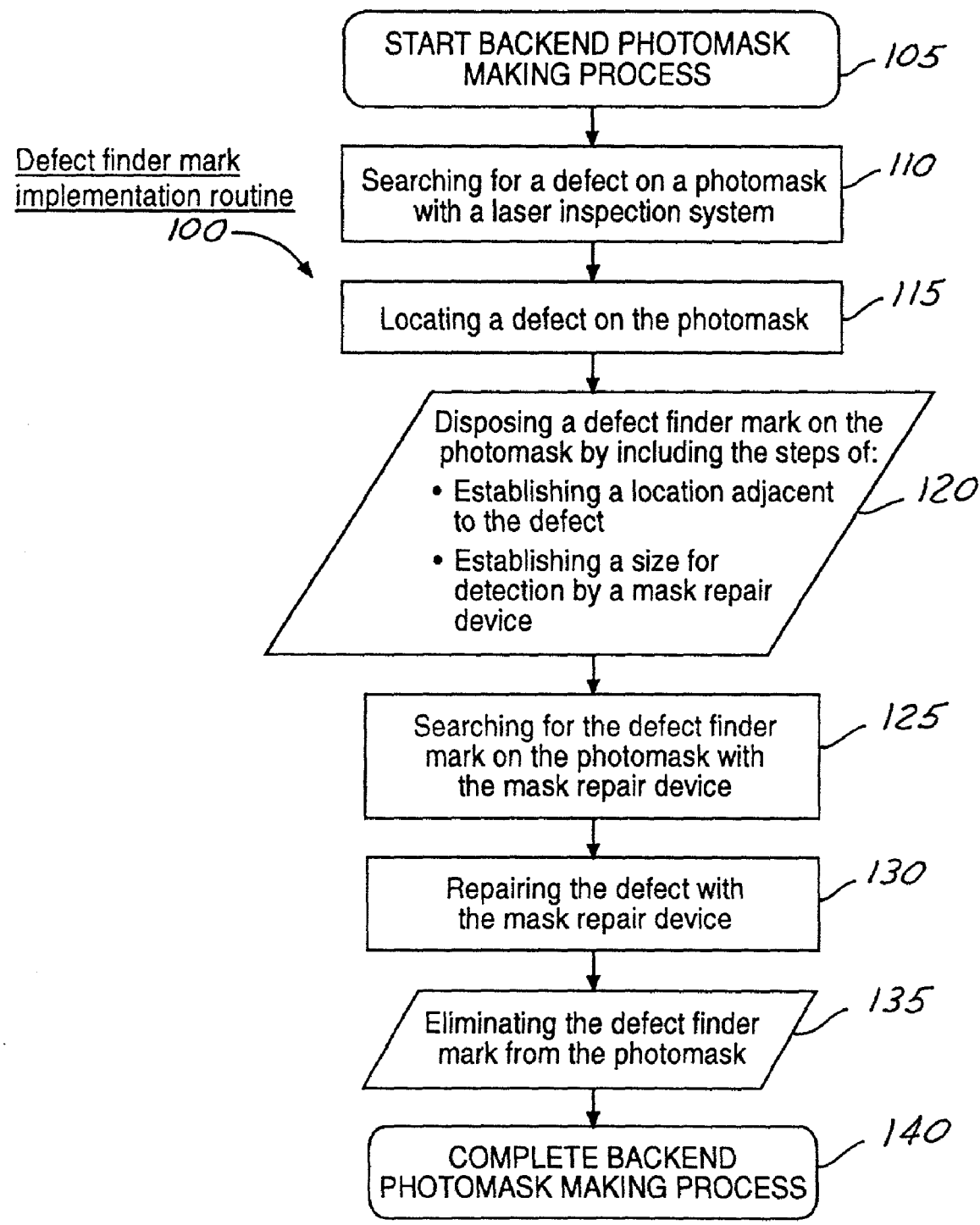
FIG. 2 is a flow diagram illustrating a defect finder mark implementation routine (100) for applying a defect finder mark to a photomask.

With reference to FIGS. 1A, 1B and 2, the back-end method for photomask making generally includes the steps of inspecting the photomask 10 and repairing each defect on the photomask 10. The back-end method further includes the step of cleaning the photomask 10 after repairing defects on the photomask. Illustratively, a wet process for cleaning the photomask 10 includes subjecting the mask substrate 12 to a mixture of acid and deionized water to clean the photomask 10 of unwanted mask substrate 12. The photomask 10 is then subjected to hot acid to remove the photoresist from the photomask 10. In addition, a dry process for cleaning the photomask 10 includes subjecting plasma to remove unwanted mask substrate 12 and the photoresist from the photomask 10.

Optionally, after the step of cleaning the photomask 10, the back-end method includes applying pellicle (not shown) to the photomask 10. The pellicle comprises a layer of transparent coating deposited on the photomask 10 at a predetermined thickness, such as for example 5 mm thick. As light passes through the photomask 10 during the photolithography process, the pellicle causes dust particles that collect on the photomask 10 to be out of focus and, thus, not produce an image on the semiconductor wafer substrate.

With specific reference to FIG. 2, the step of inspecting the photomask 10 preferably comprises a defect finder mark implementation routine 100. Those of ordinary skill in the art will readily recognize that the defect finder mark implementation routine 100 may be executed by either a photomask making technician, as is preferred, or by a computer code-based program. In general, as shown in FIGS. 1A and 1B, the defect finder mark implementation routine 100 deposits a defect finder mark 30 on the photomask 10. The defect finder mark 30 facilitates easy location of a defect during the back-end process so that the defect 55 may be repaired.

The defect finder mark implementation routine 100 of FIG. 2 begins with step 105 by initiating the back-end photomask making process. Accordingly, the photomask 10 is inspected for defects 55. For inspection, the defect finder implementation routine 100 preferably utilizes a mask marking inspection system. Specifically, in step 105, the mask marking inspection system receives the photomask 10 for inspection thereof.

Although a detailed description of the mask inspection system is out of the scope of the present invention, the mask marking inspection system generally includes a photomask inspection apparatus and a mark installer linked with the photomask inspection apparatus. The photomask inspection apparatus comprises a photomask inspection apparatus of a type well known in the industry, such as for example a Defect Review Tool (DRT) manufactured by SEMATECH of Austin, Tex. The mark installer operates in cooperation with the photomask inspection apparatus so that the mark installer physically marks the photomask 10. In the preferred embodiment, the mark installer comprises a laser cutter for subjecting the photomask 10 to laser ablation, such as a laser Type CW laser diode (LD) pumped solid state laser. Oscillation wavelength is in the range of 0.351 µm. Pulse duration is in the range of 300 ps or less.

Inspection includes a routine for defect capturing. Thus, referring to FIG. 2, the routine for defect capturing includes steps 110 and 115. Specifically, in step 110, the mask marking inspection system searches the photomask 10 for defects 55. FIG. 1B illustrates a mask marking inspection system field of view display 60 for showing enlarged images of the mask pattern 14 and substrate 12 of the photomask 10 of FIG. 1A. For one preferred embodiment, the mask marking inspection field of view display 60 comprises a focused ion beam image of the photomask.

In the preferred embodiment, searching the photomask 10 for defects 55 includes searching about the dense pattern array 20 of the photomask 10. Moreover, searching the photomask 10 for defects 55 includes searching for elusive defects. Optionally, in FIG. 1B, the mask marking inspection system field of view display 60 may include a crosshair finder 65 for establishing a reference location with respect to the mask marking inspection system as the photomask 10 is searched for defects 55.

In step 115 of FIG. 2, the mask marking inspection system locates each defect 55 on the photomask 10. Illustratively, for step 115, the mask marking inspection system may be required to only identify and locate defects 55 greater than one tenth of a micrometer in size and/or having a transmission loss of greater than five percent as detected by the mask marking inspection system. As an example of a defect, a chrome mask pattern 14 may undesirably include either an extension or protrusion that is greater than one tenth of a micrometer in size.

Once the defect 55 is captured, the defect finder mark implementation routine 100 advances from step 115 to step 120. In step 120, a defect finder mark 30 is disposed on the photomask 10. Shown in step 120 of FIG. 2, disposing the defect finder mark 30 includes establishing a location of the defect finder mark 30 that is adjacent to the defect 55. Preferably, by establishing an adjacent location, the defect finder mark 30 facilitates quick and easy location of a corresponding defect 55 about the photomask 10, especially for locating elusive defects and defects within a dense pattern array.

Depositing the defect finder mark 30 further includes establishing a size for the defect finder mark 30. In the preferred embodiment, the defect finder mark constitutes a size that is detectable by a mask repair device (not shown). Current laser technology can implement 0.3 µm spot size on mask pattern. Accordingly, the defect finder mark directs the mask repair device to the vicinity of the corresponding defect 55 so that the mask repair device can identify and eliminate the defect 55 from the photomask 10.

Specifically, referring to FIG. 1B, the defect finder mark 30 is disposed on the photomask 10 via the mark installer of the mask marking inspection system. Therefore, the mark installer cuts a cavity defining the defect finder mark 30 into the photomask 10 according to the required size and location for detection by the mask repair device. In the preferred embodiment, the defect finder mark 30 is cut into the mask pattern 14 so that the defect finder mark 30 can be eliminated from the photomask by standard defect repair procedures used in the industry. By deposition on the photomask 10, the defect finder mark 30 reliably facilitates location of the corresponding defect 55 despite variations in image resolution and photomask positioning or, commonly, "stage movement" between the mask marking inspection system and the mask repair device.

Those of ordinary skill in the art will recognize that steps 110, 115, and 120 associated, respectively, with defect capturing and defect finder mark deposition may be repeated for each defect on the photomask 10. Thus, in step 125 of the defect finder mark implementation routine 100, the photomask 10 with at least one defect finder mark 30 thereon is removed from the mask marking inspection system and received by the repair device. Additionally, in step 125, the mask repair device searches for the defect finder mark 30 on the photomask 10.

In step 135, the mask repair device repairs the defect 55 that is adjacent with the defect finder mark 30. Illustratively, the mask repair device may include a focused ion beam repair tool to remove the defect 55 from the photomask 10. In addition to repairing the defect 55 in step 135, the mask repair device in step 135 then eliminates the respective defect finder mark 30 from the photomask 10. Those of ordinary skill in the art will recognize that any suitable defect repair procedure used in the industry for removing defects 55 from the photomask 10 can also be applied for eliminating the defect finder mark 30. For example, the cavity cut into the mask pattern 14 that defines the defect finder mark 30 is filled with a filling agent. Preferably, the filling agent comprises carbon film that is deposited on the defect finder mark according to a "clear-defect" repair procedure commonly used in the industry to thus eliminate the defect finder mark 30 from the photomask 10.

Referring to FIG. 2, the defect finder mark implementation routine 100 concludes in step 140 by completing the back-end photomask making process so that, ultimately, the defect 55 on the photomask 10 is repaired. Accordingly, the front-end and back-end methods for photomask making ensure that the repaired photomask 10 reliably forms a photoresist image on the semiconductor wafer substrate that corresponds to the mask pattern 14.

Although the present invention has been described in terms of the foregoing embodiment, such description has been for exemplary purposes only and, as will be apparent to those of ordinary skill in the art, many alternatives, equivalents, and variations of varying degrees will fall within the scope of the present invention. That scope, accordingly, is not to be limited in any respect by the foregoing description, rather, it is defined only by the claims that follow.

What is claimed is:

1. A method of removing defects in a back-end photomask making process, comprising the steps of:
   (a) searching for a defect on a photomask with a mask marking inspection system, the mask marking inspection system including a photomask inspection apparatus and a mark installer linked with the photomask inspection apparatus;
   (b) disposing a defect finder mark on the photomask patterned portion with the mark installer;
   (c) repairing the defect, and
   (d) eliminating the defect finder mark.

2. The method according to claim 1 wherein the step of searching for a defect on a photomask includes the step of locating a defect on the photomask.

3. The method according to claim 1 wherein the step of searching for a defect includes the step of searching for the defect about a dense pattern array of the photomask.

4. The method according to claim 1 wherein the step of searching for a defect includes the step of searching for an elusive defect.

5. The method according to claim 1 wherein the step of disposing a defect finder mark on the photomask includes the step of establishing a location of the defect finder mark that is adjacent to the defect.

6. The method according to claim 1 wherein the step of disposing a defect finder mark on the photomask includes the step of establishing a size for the defect finder mark so that the defect finder mark is detected with a mask repair device.

7. The method according to claim 1 further comprising the step of searching for the defect finder mark on the photomask with the mask repair device.

8. The method according to claim 1 wherein the step of eliminating the defect includes depositing a filling agent on the defect finder mark.

9. The method according to claim 1 further including the step of forming a photoresist image on a wafer substrate with the photomask.

10. A back-end method for photomask making, comprising the steps of:
    (a) inspecting a photomask, inspecting including the steps of searching for a defect on the photomask with a mask marking inspection system, the mask marking inspection system including a photomask inspection apparatus and a mark installer linked with the photomask inspection apparatus, and disposing a defect finder mark on the photomask patterned portion with the mark installer;
    (b) repairing the defect on the photomask; and
    (c) eliminating the defect finder mark from the photomask.

11. The back-end method according to claim 10 further comprising the step of cleaning the photomask.

12. The back-end method according to claim 10 further comprising the step of applying pellicle to the photomask.

13. The back-end method according to claim 10 wherein the step of searching for a defect includes the step for searching for the defect about a dense pattern array of the photomask.

14. The back-end method according to claim 10 wherein the step of searching for a defect includes the step of searching for an elusive defect.

15. The back-end method according to claim 10 wherein the step of disposing a defect finder mark on the photomask includes the step of establishing a location of the defect finder mark that is adjacent to the defect.

16. The back-end method according to claim 10 wherein the step of disposing a defect finder mark on the photomask includes the step of establishing a size for the defect finder mark so that the defect finder mark is detected with a mask repair device.

17. The back-end method according to claim 10 further comprising the step of searching for the defect finder mark on the photomask with the mask repair device.

* * * * *